(12) United States Patent
Rueckes et al.

(10) Patent No.: US 7,075,141 B2
(45) Date of Patent: Jul. 11, 2006

(54) FOUR TERMINAL NON-VOLATILE TRANSISTOR DEVICE

(75) Inventors: Thomas Rueckes, Boston, MA (US); Brent M. Segal, Woburn, MA (US); Bernard Vogeli, Boston, MA (US); Darren K. Brock, Elmsford, NY (US); Venkatachalam C. Jaiprakash, Fremont, CA (US); Claude L. Bertin, South Burlington, VT (US)

(73) Assignee: Nantero, Inc., Woburn, MA (US)

( * ) Notice: Subject to any disclaimer, the term of this patent is extended or adjusted under 35 U.S.C. 154(b) by 46 days.

(21) Appl. No.: 10/811,191

(22) Filed: Mar. 26, 2004

(65) Prior Publication Data

US 2005/0047244 A1    Mar. 3, 2005

Related U.S. Application Data

(60) Provisional application No. 60/459,253, filed on Mar. 28, 2003.

(51) Int. Cl.
H01L 27/10 (2006.01)
H01L 29/788 (2006.01)

(52) U.S. Cl. ............. 257/316; 257/209; 977/708; 977/932

(58) Field of Classification Search .......... 257/209, 257/314, 316, 34, 393, 663; 977/708, 932
See application file for complete search history.

(56) References Cited

U.S. PATENT DOCUMENTS

| | | |
|---|---|---|
| 3,448,302 A | 6/1969 | Shanefield |
| 4,845,533 A | 7/1989 | Pryor et al. |
| 4,853,893 A | 8/1989 | Eaton et al. |
| 4,876,667 A | 10/1989 | Ross et al. |
| 4,888,630 A | 12/1989 | Paterson |
| 5,198,994 A | 3/1993 | Natori |
| 6,044,008 A | 3/2000 | Choi |
| 6,128,214 A | 10/2000 | Kuekes et al. |
| 6,159,620 A | 12/2000 | Heath et al. |
| 6,183,714 B1 | 2/2001 | Smalley et al. |
| 6,198,655 B1 | 3/2001 | Heath et al. |
| 6,221,330 B1 | 4/2001 | Moy et al. |
| 6,232,706 B1 | 5/2001 | Dai et al. |
| 6,445,006 B1 | 9/2002 | Brandes et al. |
| 6,518,156 B1 | 2/2003 | Chen |
| 6,548,841 B1 | 4/2003 | Frazier et al. |
| 6,559,468 B1 | 5/2003 | Kuekes et al. |
| 6,574,130 B1 | 6/2003 | Segal et al. |
| 6,643,165 B1 | 11/2003 | Segal et al. |
| 6,673,424 B1 | 1/2004 | Lindsay |
| 6,706,402 B1 | 3/2004 | Rueckes et al. |
| 6,750,471 B1 | 6/2004 | Bethune et al. |
| 6,759,693 B1 | 7/2004 | Vogeli et al. |
| 6,774,052 B1 | 8/2004 | Vogeli et al. |
| 6,781,166 B1 | 8/2004 | Lieber et al. |
| 6,784,028 B1 | 8/2004 | Rueckes et al. |
| 6,803,840 B1 | 10/2004 | Hunt et al. |
| 6,809,465 B1 | 10/2004 | Jin |
| 6,919,592 B1 * | 7/2005 | Segal et al. ................. 257/209 |
| 2002/0130311 A1 | 9/2002 | Lieber et al. |
| 2002/0130353 A1 | 9/2002 | Lieber et al. |
| 2002/0172963 A1 | 11/2002 | Kelley et al. |
| 2002/0179434 A1 | 12/2002 | Dai et al. |
| 2003/0021966 A1 | 1/2003 | Segal et al. |
| 2003/0124325 A1 | 7/2003 | Rueckes et al. |
| 2003/0124837 A1 | 7/2003 | Rueckes et al. |
| 2003/0165074 A1 | 9/2003 | Segal et al. |
| 2003/0199172 A1 | 10/2003 | Rueckes et al. |
| 2003/0234407 A1 | 12/2003 | Vogeli et al. |
| 2003/0236000 A1 | 12/2003 | Vogeli et al. |
| 2004/0085805 A1 | 5/2004 | Segal et al. |
| 2004/0159833 A1 | 8/2004 | Rueckes et al. |
| 2004/0164289 A1 | 8/2004 | Rueckes et al. |
| 2004/0175856 A1 | 9/2004 | Jaiprakash et al. |
| 2004/0181630 A1 | 9/2004 | Jaiprakash et al. |
| 2004/0191978 A1 | 9/2004 | Rueckes et al. |
| 2004/0214366 A1 | 10/2004 | Segal et al. |
| 2004/0214367 A1 | 10/2004 | Segal et al. |
| 2005/0041465 A1 | 2/2005 | Rueckes et al. |
| 2005/0041466 A1 | 2/2005 | Rueckes et al. |
| 2005/0056877 A1 | 3/2005 | Rueckes et al. |

FOREIGN PATENT DOCUMENTS

| WO | WO 01/03208 A1 | 1/2001 |
|---|---|---|
| WO | WO 01/44796 A1 | 6/2001 |
| WO | WO 03/091486 A1 | 11/2003 |
| WO | WO 04/065655 A1 | 8/2004 |
| WO | WO 04/065657 A1 | 8/2004 |
| WO | WO 04/065671 A1 | 8/2004 |

OTHER PUBLICATIONS

Choi, W.B. et al., "Carbon-nanotube-based nonvolatile memory with oxide-nitride-film and nanoscale channel," *Appl. Phys. Lett.*, 2003, vol. 82(2), pp. 275-277.

Dequesnes, M. et al., "Calculation of pull-in voltages for carbon-nanotube-based nanoelectromechanical switches," *Nanotechnology*, 2002, vol. 13, pp. 120-131.

Dequesnes, M. et al., "Simulation of carbon nanotube-based nanoelectromechanical switches," *Computational Nanoscience and Nanotechnology*, 2002, pp. 383-386.

Wolf, S., Silicon Processing for the VLSI Era; vol. II—Manufacturing Yield and Reliability Issues of VLSI Interconnects, 1991, Lattice Press, Sunset Beach, pp. 260-273.

Wolf, S., Multilevel-Interconnect Technology for VLSI and ULSI, 1990, Lattice Press, Sunset Beach, pp. 189-191.

Tour, J. M. et al., "NanoCell Electronic Memories," *J. Am. Chem. Soc.*, 2003, vol. 125, ppl 13279-13283.

Rueckes, T., et al., "Carbon Nanotube-Based Nonvolatile Random Access Memory for Molecular Computing" *Science*, 2000, vol. 289, pp. 94-97.

Fan, S. et al., "Carbon nanotube arrays on silicon substrates and their possible application," *Physica E*, 2000, vol. 8, pp. 179-183.

Zhan, W. et al., "Microelectrochemical Logic Circuits," *J. Am. Chem. Soc.*, 2003, vol. 125, pp. 9934-9935.

Soh, H. T. et al., "Integrated nanotube circuits: Controlled growth and ohmic contacting of single-walled carbon nanotubes," *Appl. Phys. Lett.*, 1999. vol. 75(5), pp. 627-629.

Kinaret, J.M. et al., "A carbon-nanotube-based nanorelay", *Appl. Phys. Lett.*, 2003, vol. 82(8), pp. 1287-1289.

Franklin, N. R. et al., "Integration of suspended carbon nanotube arrays into electronic devices and electromechanical systems," *Appl. Phys. Lett.*, 2002,vol. 81(5), pp. 913-915.

Avouris, Ph., "Carbon nanotube electronics," Chem. Physics, 2002, vol. 281, pp. 429-445.

Dai, H. et al., "Controlled Chemical Routes to nanotube Architectures, Physics, and Devices," *J. Phys. Chem. B*, 1999. vol. 103, pp. 111246-11255.

Homma, Y. et al., "Growth of Suspended Carbon Nanotubes Networks on 100-nm-scale Silicon Pillars," *Appl. Phys. Lett.*, 2002, vol. 81(12), pp. 2261-2263.

Ajayan, P.M., et al., "Nanometre-size tubes of carbon," *Rep. Prog. Phys.*, 1997. vol. 60, pp. 1025-1062.

Sreekumar, T.V., et al., "Single-wall Carbon Nanotube Films", *Chem. Mater. 2003*, vol. 15, pp. 175-178.

Verissimo-Alves, M. et al., "Electomechanical effects in carbon nanotubes: *Ab initio* and analytical tight-binding calculations," *Phys. Rev. B*, 2003, vol. 67, pp. 161401-1-161401-4.

Fuhrer, M.S. et al., "High-Mobility Nanotube Transistor Memory," *Nano Letters*, 2002, vol. 2(7), pp. 755-759.

Radosavljevic, M. et al., "Nonvolatile molecular memory elements based on ambipolar nanotube field effect transistors," *Nano Letters*, 2002, vol. 2(7), pp. 761-764.

Farajian, A. A. et al., "Electronic transport through bent carbon nanotubes: Nanoelectromechanical sensors and switches," *Phys. Rev. B*, 2003, vol. 67, pp. 205423-1-205423-6.

Fischer, J.E. et al., "Magnetically aligned single wall carbon nanotube films: Preferred orientation and anisotropic transport properties," *Journal of Appl. Phys.*, 2003, vol. 93(4), pp. 2157-2163.

Lee, K.H. et al., "Control of growth orientation for carbon nanotubes," *Appl. Phys. Lett.*, 2003, vol. 82(3), pp. 448-450.

Casavant, M.J. et al., "Neat macroscopic membranes of aligned carbon nanotubes," *Journal of Appl. Phys.*, 2003, vol. 93(4), pp. 2153-2156.

Ami, S. et al., "Logic gates and memory cells based on single $C_{60}$ electromechanical transistors," *Nanotechnology*, 2001, vol. 12, pp. 44-52.

Dehon, A., "Array-Based Architecture for FET-Based, Nanoscale Electronics," *IEEE Transactions on Nanotechnology*, 2003, vol. 2(1), pp. 23-32.

Tans, S. et al., "Room-temperature based on a single carbon nanotube," *Nature*, 1998. vol. 393, pp. 49-52.

Cui, J.B. et al., "Carbon Nanotube Memory Devices of High Charge Storage Stability," *Appl. Phys. Lett.*, 2002, vol. 81(17), pp. 3260-3262.

Robinson, L.A.W., "Self-Aligned Electrodes for Suspended Carbon Nanotube Structures," *Microelectronic Engineering*, 2003, vol. 67-68, pp. 615-622.

\* cited by examiner

*Primary Examiner*—Michelle Estrada
(74) *Attorney, Agent, or Firm*—Wilmer Cutler Pickering Hale and Dorr LLP (57) ABSTRACT

A four terminal non-volatile transistor device. A non-volatile transistor device includes a source region and a drain region of a first semiconductor type of material and each in electrical communication with a respective terminal. A channel region of a second semiconductor type of material is disposed between the source and drain region. A floating gate structure is made of at least one of semiconductive or conductive material and is disposed over the channel region. A control gate is made of at least one of semiconductive or conductive material and is in electrical communication with a respective terminal. An electromechanically-deflectable nanotube switching element is in electrical communication with one of the floating gate structure and the control gate structure, and is positioned to be electromechanically deflectable into contact with the other of the floating gate structure and the control gate structure. When the nanotube switching element is in communication with both the control gate and the floating gate, the control gate may be used to modulate the conductivity of the channel region. The nanotube switching element may be formed from a porous fabric of a monolayer of single-walled carbon nanotubes. Under certain embodiments, the nanotube article is suspended vertically in relation to the horizontal substrate. Under certain embodiments, a release gate and release node are positioned in spaced relation to the nanotube switching element, and, in response to a signal on the release node, the release gate electromechanically deflects the nanotube switching element out of contact with the one of the control gate and floating gate. Under certain embodiments, the contact between the nanotube switching element and the one of the control gate and floating gate is a non-volatile state. Under certain embodiments, the device occupies an area of $8F^2$.

19 Claims, 11 Drawing Sheets

CHANNEL REGION MODULATION

FIG 4a

Inverted Channel: electrons at V = 0 volts

FIG 4b

Depleted Channel: electrons flow to positive terminal

WRITE "1": "OFF" ⟶ "ON"

NT Select Voltage $V_{NT\,SELECT} = V_{CG} - V_{FGNT} = 1.25\ v$
FIG 5a

WRITE "0": "OFF" ⟶ "OFF"

NT Select Voltage $V_{NT\,SELECT} = V_{CG} - V_{FGNT} = 0.4\ v$
FIG 5b

NET: SELECT VOLTAGE THRESHOLD RANGE > 0.4 v & < 1.25 v

FOUR TERMINAL NON-VOLATILE TRANSISTOR DEVICE

CROSS-REFERENCE TO RELATED APPLICATION

This application claims the benefit under 35 U.S.C. 119(e) of U.S. Provisional Patent Application No. 60/459,253, filed on Mar. 28, 2003, entitled Single Transistor with Integrated Nanotube (NT-FET).

This application is related to the following U.S. applications, the contents of which are incorporated herein in their entirety by reference:

- U.S. Provisional Apl. Ser. No. 60/459,223 filed on Mar. 28, 2003, entitled NRAM Bit Selectable Two-Device Nanotube Array; and U.S. patent application Ser. No. (inserted upon USPTO designation), filed on the same day as the present application, entitled NRAM Bit Selectable Two-Device Nanotube Array.
- U.S. Provisional Apl. Ser. No. 60/459,222 filed on Mar. 28, 2003, entitled NRAM Byte/Block Released Bit Selectable One-Device Nanotube Array; and U.S. patent application Ser. No. (inserted upon USPTO designation), filed on the same day as the present application, entitled Non-Volatile Ram Cell and Array Using Nanotube Switch Position for Information State.
- U.S. Provisional Patent Application No. 60/459,224, filed on Mar. 28, 2003, entitled Nanotube-on-Gate FET Structures and Applications; and U.S. patent application Ser. No. (inserted upon USPTO designation), filed on the same day as the present application, entitled Nanotube-on-Gate FET Structures and Applications.

BACKGROUND

1. Technical Field

The invention relates to non-volatile transistors and particularly to non-volatile transistors using nanotube (NT) switching components.

2. Discussion of Related Art

Important characteristics for a memory cell in electronic device are low cost, nonvolatility, high density, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM), and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM, and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some emerging technologies have attempted to address these shortcomings.

For example, magnetic RAM (MRAM) or ferromagnetic RAM (FRAM) utilizes the orientation of magnetization or a ferromagnetic region to generate a nonvolatile memory cell. MRAM utilizes a magnetoresistive memory element involving the anisotropic magnetoresistance or giant magnetoresistance of ferromagnetic materials yielding nonvolatility. Both of these types of memory cells have relatively high resistance and low-density. A different memory cell based upon magnetic tunnel junctions has also been examined but has not led to large-scale commercialized MRAM devices. FRAM uses a circuit architecture similar to DRAM but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893, 4,888,630, and 5,198,994.

Another technology having non-volatile memory is phase change memory. This technology stores information via a structural phase change in thin-film alloys incorporating elements such as selenium or tellurium. These alloys are purported to remain stable in both crystalline and amorphous states allowing the formation of a bi-stable switch. While the nonvolatility condition is met, this technology appears to suffer from slow operations, difficulty of manufacture and reliability and has not reached a state of commercialization. See U.S. Pat. Nos. 3,448,302, 4,845,533, 4,876,667, and 6,044,008.

Wire crossbar memory (MWCM) has also been proposed. See U.S. Pat. Nos. 6,128,214, 6,159,620, and 6,198,655. These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

Recently, memory devices have been proposed which use nanoscopic wires, such as single-walled carbon nanotubes, to form crossbar junctions to serve as memory cells. See WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94–97, 7 Jul. 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals to date rely on directed growth or chemical self-assembly techniques to grow the individual nanotubes needed for the memory cells. These techniques are now believed to be difficult to employ at commercial scales using modem technology. Moreover, they may contain inherent limitations such as the length of the nanotubes that may be grown reliably using these techniques, and it may difficult to control the statistical variance of geometries of nanotube wires so grown.

The ideal memory for at least some purposes is one which would offer low cost per bit, high density, fast random access, read/write cycle times of equal duration, low power consumption, operation over a wide temperature range, a single low-voltage power supply, with a high degree of radiation tolerance. The non-volatile described herein cell offers high speed read, but also high speed write (nanosecond) versus the slow (microsecond & millisecond) write time of EEPROM and FLASH EEPROM type of memories. The memory is much denser than conventional SRAM because it has a two-device, NT and 3-array line structure, and offers competitive performance. The density is less than that of DRAM cells, however, the product offers NDRO operation and non-volatility.

U.S. Patent Publication No. 2003-0021966 discloses, among other things, electromechanical circuits, such as memory cells, in which circuits include a structure having electrically conductive traces and supports extending from a surface of a substrate. Nanotube ribbons that can electromechanically deform, or switch are suspended by the supports that cross the electrically conductive traces. Each ribbon comprises one or more nanotubes. The ribbons are typically formed from selectively removing material from a layer or matted fabric of nanotubes.

For example, as disclosed in U.S. Patent Publication No. 2003-0021966, a nanofabric may be patterned into ribbons, and the ribbons can be used as a component to create non-volatile electromechanical memory cells. The ribbon is electromechanically-deflectable in response to electrical stimulus of control traces and/or the ribbon. The deflected, physical state of the ribbon may be made to represent a corresponding information state. The deflected, physical state has non-volatile properties, meaning the ribbon retains its physical (and therefore informational) state even if power to the memory cell is removed. As explained in U.S. Patent Publication No. 2003-0124325, three-trace architectures may be used for electromechanical memory cells, in which the two of the traces are electrodes to control the deflection of the ribbon.

SUMMARY

The invention provides non-volatile transistor devices. According to one aspect of the invention, a non-volatile transistor device includes a source region and a drain region of a first semiconductor type of material and each in electrical communication with a respective terminal. A channel region of a second semiconductor type of material is disposed between the source and drain region. A gate structure is made of at least one of semiconductive or conductive material and disposed on an insulator over the channel region and is not in permanent contact with a corresponding terminal. A control gate is made of at least one of semiconductive or conductive material and in electrical communication with a respective terminal. An electromechanically-deflectable nanotube switching element is in electrical communication with one of the gate structure and the control gate structure and is positioned to be electromechanically deflectable into contact with the other of the gate structure and the control gate structure. When the nanotube switching element is in communication with both the control gate and the gate structure, the control gate may be used to modulate the conductivity of the channel region.

According to another aspect of the invention, the transistor gate is embedded in and surrounded by an insulator material. The channel region resistance is modulated by the transistor gate voltage capacitively coupled to the channel region. When the electromechanically deflectable nanotube switching element switches into contact with the control gate element, electric charges briefly flow to charge the internal gate capacitance network, including the capacitor between transistor gate and channel regions. No electrical current flows because the transistor gate is surrounded by insulating material. The absence of electrical current flow as the nanotube switching element comes into contact with the control gate may be referred to as cold switching, and maximizes the allowed number of contact/release cycles. Typically, the expected number of allowable contact/release cycles is in excess of $10^{15}$ cycles.

According to another aspect of the invention, the nanotube switching element is an article formed from a porous fabric of nanotubes.

According to another aspect of the invention, the fabric is substantially a monolayer of nanotubes.

According to another aspect of the invention, the nanotubes are single-walled carbon nanotubes.

According to another aspect of the invention, the source and drain regions are disposed on or in a horizontal substrate and wherein the nanotube article is suspended vertically in relation to the horizontal substrate.

According to another aspect of the invention, the nanotube article is in physical and electrical contact with the gate structure.

According to another aspect of the invention, the device further includes a release gate and release node positioned in spaced relation to the nanotube switching element, wherein, in response to a signal on the release node, the release gate electromechanically deflects the nanotube switching element out of contact with the one of the control gate and the gate structure.

According to another aspect of the invention, the release gate surface is coated with an insulating, semiconducting, or conducting layer.

According to another aspect of the invention, the contact between the nanotube switching element and the one of the control gate and gate structure is a non-volatile state.

According to another aspect of the invention, the contact between the nanotube switching element and the insulating, semiconducting, or conducting layer on the release gate is a non-volatile state.

According to another aspect of the invention, the device occupies an area of $8F^2$.

According to another aspect of the invention, an array of such devices is provided in which a release node is shared among at least two adjacent devices.

BRIEF DESCRIPTION OF THE DRAWING

In the Drawing,

FIG. 4b depicts the channel region below one terminal of the four terminal device when modulated in a different way than that of FIG. 4a;

DETAILED DESCRIPTION

Preferred embodiments of the invention provide a four terminal non-volatile transistor device. These embodiments, in essence, integrate a nanotube (NT) structure (such as a nanofabric article or ribbon) with a FET transistor. In preferred cases, the NT is integrated in such a way that external transistor connections are made only to the FET transistor terminals for deflecting the NT element into contact with the control gate, and the NT is switched internal to the device. The release gate is accessed directly. However, there is no direct contact to the NT element itself. Such a device is referred to as an NT-FET (nanotube-FET) device herein, and its construction and operation are described below.

The single transistor NT-FET can be used in many applications, for example, an NRAM memory array of very small cell size. When used in such a non-volatile memory array, preferred layout designs occupy less than 8 $F^2$ cell area with bit selectivity for read, release, and write operations. There are many other applications because the NT-FET transistor is such a versatile active electrical element. For example, NT-FET devices in product chips can be used to repeatedly change on-chip generated timings and voltages after fabrication at the wafer level, or after chip assembly at the module, card, or system level. This can be done at the factory, or remotely in field locations. Such usage can enhance product yield, lower power, improve performance, and enhance reliability in a wide variety of products.

Figure 1A:
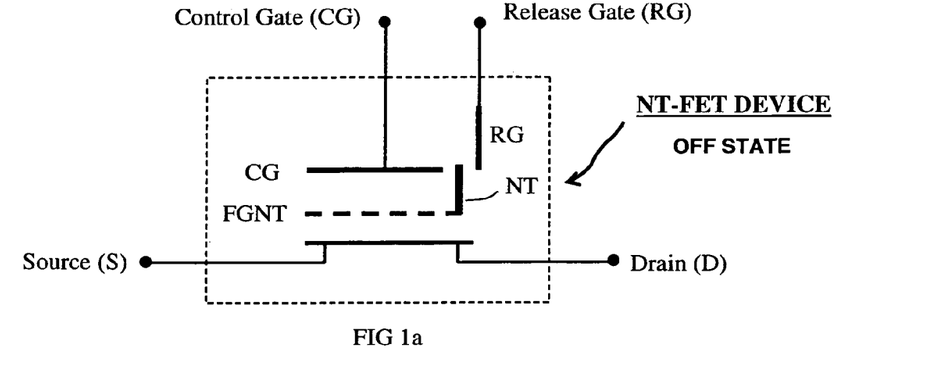
FIGS. 1a and 1b are circuit schematics, illustrating two states of a four terminal non-volatile transistor device of certain embodiments of the invention.
Figure 1B:
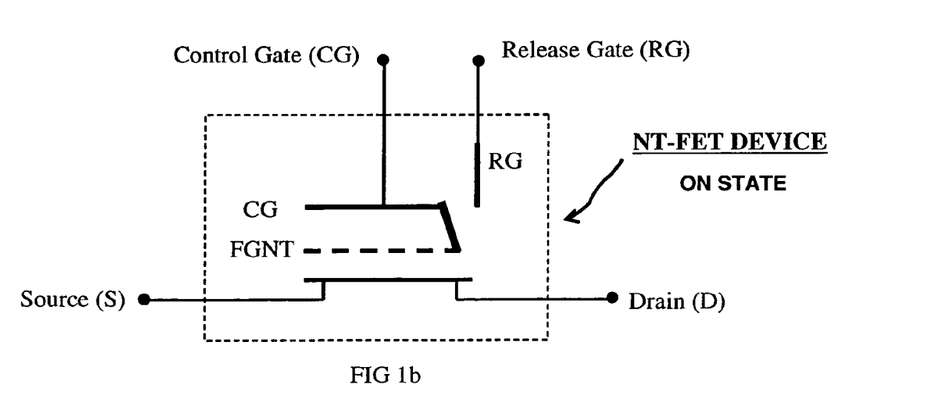

A preferred NT-FET device has four terminals as shown in FIGS. 1a–b: a control gate (CG), source (S), drain (D), and a reset gate (RG). A floating gate (FG) and nanotube (NT) structure are combined to form a single floating gate nanotube (FGNT) element. The FGNT interacts with control gate (CG), release gate (RG) and the FET channel as described below.

FIG. 1a illustrates the NT-FET in an OFF state in which the FGNT is electrically isolated from the terminals. This state is non-volatile. FIG. 1b illustrates the NT-FET in an ON state in which the FGNT is electrically connected to control gate CG. This state is also non-volatile.

Preferred embodiments include NFET and PFET CMOS devices, particularly NFET array devices in combination with nanotube electromechanical (NT) switch elements to provide unit cells that may be employed in integrated circuits. The nanotube electromechanical switch elements are formed from matted, porous fabrics of nanotubes as described below.

The NT is attached mechanically and electrically to a polysilicon floating gate to form the FGNT element that, in combination with CG, controls the channel of the NT-FET between the source (S) and drain (D) terminals. Switching the FGNT from the OFF state to the ON state, as shown in FIG. 1, is controlled by applying appropriate voltages VNT SELECT between CG and FGNT. Switching from the ON state to the OFF state is controlled by the difference in voltage VNT RELEASE between the release gate RG and floating gate nanotube element FGNT. Typical read and write operating voltages for the NT-FET device is in the range of 1 to 2.5 volts. Release operations require a higher voltage.

Figure 2A:
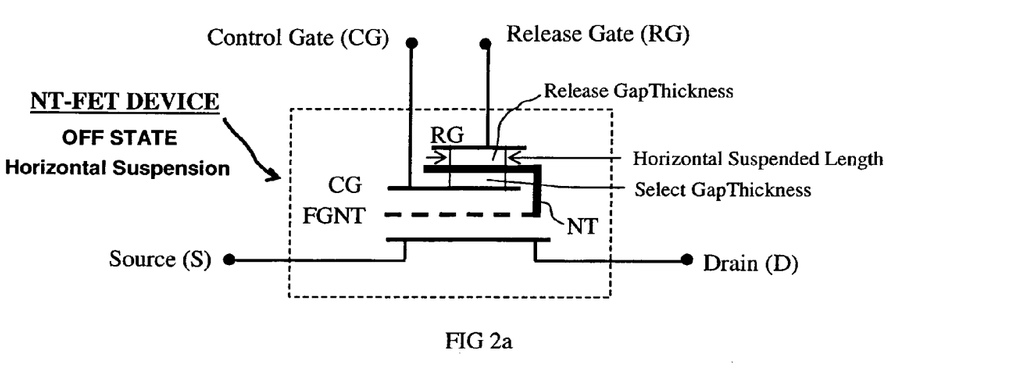
FIGS. 2a and 2b are circuit schematics, illustrating two physical arrangements of a four terminal non-volatile transistor device of certain embodiments of the invention.
Figure 2B:
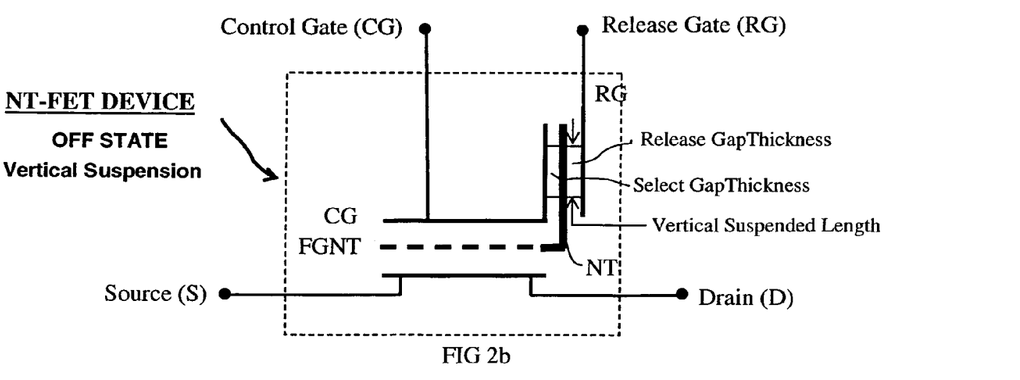

The NT carbon fabric is suspended between control gate CG and release gate RG. As shown in FIGS. 2a–b, the suspended NT fabric may be suspended horizontally or vertically. Typical suspended NT lengths are in the 90–180 nm range with gaps in the 5–30 nm range, for example.

The NT-FET device operation requires modulation of the channel region between the drain D and source S to make the channel conductive or not. This modulation is affected by a combination of voltages applied to control gate CG, drain D, and capacitive coupling effects. The capacitive coupling is between control gate CG, floating gate nanotube element FGNT, and the channel region (analogous to that in EPROM, EEPROM, and Flash EEPROM device structures).

Figure 3A:
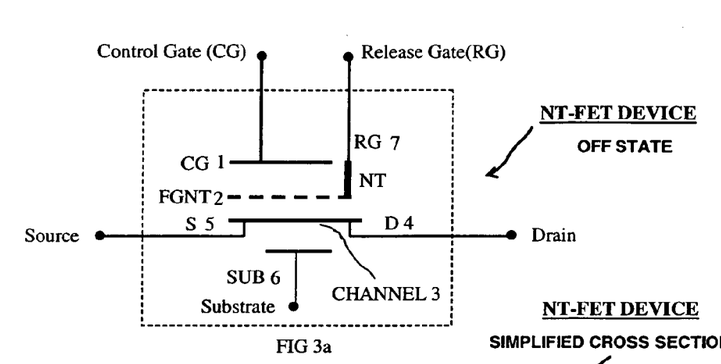
FIGS. 3a and 3b are circuit schematics, illustrating one state of a four terminal non-volatile transistor device of certain embodiments of the invention and illustrating inherent capacitances of such a device in such a state.
Figure 3B:
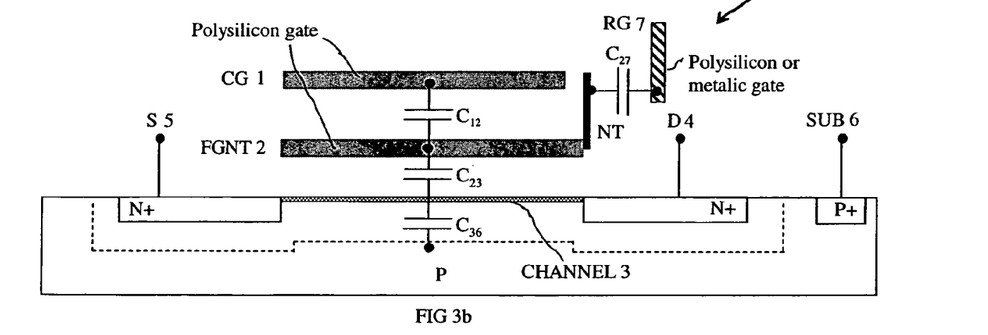

FIG. 3 illustrates key capacitance coupling in the NT-FET device structure. The capacitance values $C_{12}$, $C_{23}$, $C_{27}$ and $C_{36}$ are a function of material properties, film thicknesses, and the layout area (design) of the capacitor plates. Capacitance $C_{12}$ is the capacitance between like numeral identified elements; e.g., control gate 1 and floating gate nanotube element 2. In addition, capacitance $C_{36}$ is a voltage-dependent capacitance modulated by drain voltage Vd. FIG. 3 illustrates key capacitance coupling between elements of the NT-FET device structure. FIG. 3a illustrates a device schematic with elements numbered to correspond to coupling capacitances. FIG. 3b illustrates a simplified cross section of the physical location of key coupling capacitors.

When the NT-FET device is in the OFF state, the coupling ratios of these capacitances determine the voltage $V_{FGNT}$, as is further explained in connection with FIG. 4. Capacitance $C_{27}$ is much smaller than capacitors $C_{12}$ and $C_{23}$ (by design), and its effect is ignored for these calculations.

Figure 4A:
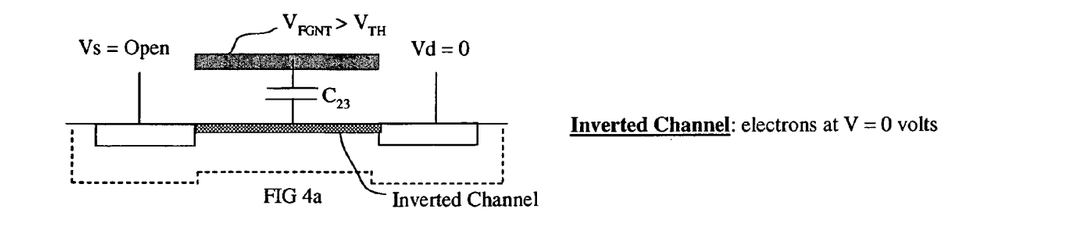
FIG. 4a depicts the channel region below one terminal of the four terminal device, when modulated in a particular way.
Figure 4B:
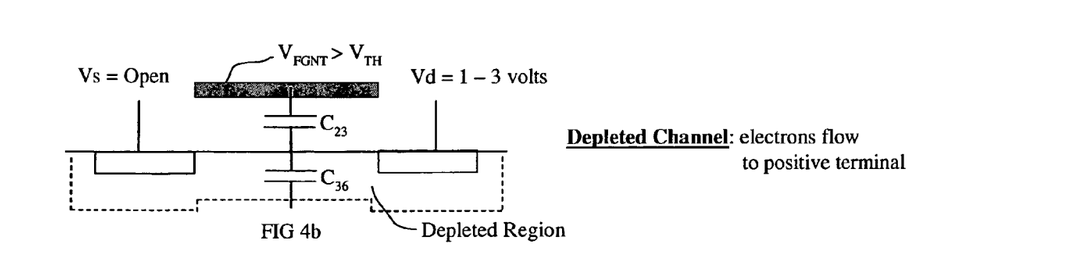

FIG. 4 focuses on the channel region below gate FGNT. Sufficient voltage to the control gate $V_{CG}$ has been applied such that the voltage on the floating gate nanotube element $V_{FGNT}$ exceeds the threshold voltage $V_{TH}$ to invert the channel region to make it conductive between drain and source. The source voltage Vs in this case floats (not forced). If the drain voltage Vd equals 0, then the inverted channel is at zero voltage, and voltage dependent capacitance $C_{36}$ is not part of the capacitance ratio controlling $V_{FGNT}$ as illustrated in FIG. 4a. In addition, FGNT is relatively tightly coupled to the inverted channel. If, on the other hand, the drain voltage is positive, electrons flow from the channel region and the channel is depleted. FGNT to channel capacitance $C_{23}$ is now in series with voltage modulated depletion capacitor $C_{36}$ as illustrated in FIG. 4b. Since $C_{36}$ is typically ⅕ the value of $C_{23}$ for this type of structure, FGNT is decoupled from the FET channel region.

Figure 5A:
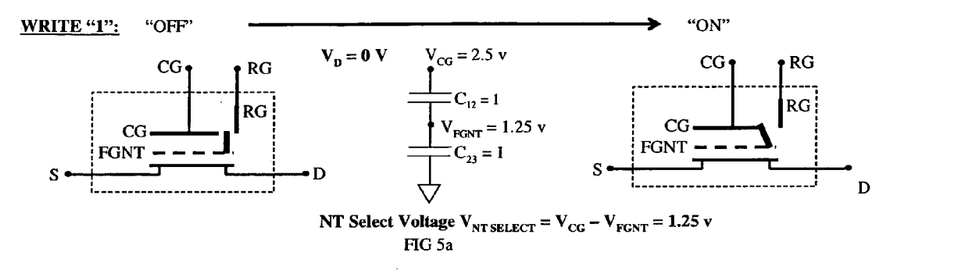
FIG. 5a depicts the switching or writing of the four terminal device and the corresponding conditions to effect such.
Figure 5B:
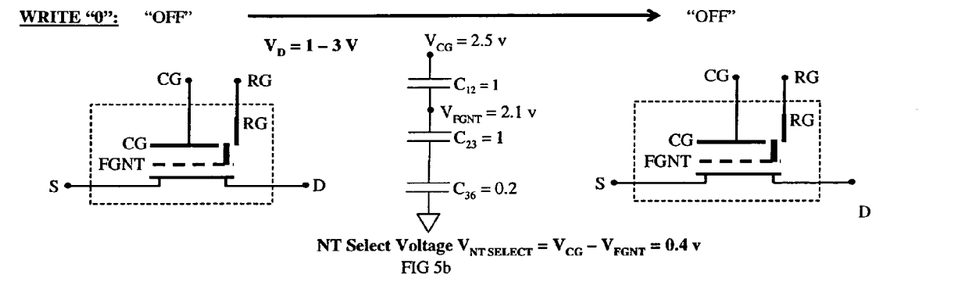
FIG. 5b depicts the switching or writing of the four terminal device and the corresponding conditions to effect such.

FIG. 5 illustrates the operations for switching of the NT-FET transistor to write a 0 or 1. The select voltage is applied between the control gate CG and floating gate nanotube element FGNT. The voltage levels internal to the NT-FET device are a function of the external applied voltages and the capacitor ratios internal to the NT-FET device. The representative voltages were calculated using relative capacitance values. In this case, $C_{12}$ equals $C_{23}$, and the value for $C_{36}$ is ⅕ of $C_{23}$.

Write "1" refers to the transition of NT-FET from the OFF to the ON state. FIG. 5a illustrates the conditions for maximizing select voltage $V_{NT\ SELECT}$ for NT switching (ohmic-like contact with CG). FIG. 5b illustrates the conditions to minimize the $V_{NT\ SELECT}$ voltage so that NT is unchanged and remains in the OFF state. In operation, an NT structure with a select voltage threshold above 0.4 volts but less than 1.25 volts may be used for a switching (write) operation.

Detecting or reading the ON or OFF state of the device is as follows. If the NT-FET device is in the ON state, CG is electrically connected to the floating gate nanotube element FGNT. For an FET device threshold of 0.7 volts, for example, $V_{CG}$ equals $V_{FGNT}$ which equals 1 volt. This forms a conductive channel between source and drain. If, however, the NT-FET device is in the OFF state, then for a control voltage $V_{CG}$ equals 1 volt and $C_{12}$ equals $C_{23}$, the FET gate voltage $V_{FGNT}$ equals 0.5 volts and no channel is formed between source and drain. Note that when reading a device in the OFF state, $V_{CG}-V_{FGNT}=0.5$ volts, so that the select threshold voltage range needs to be above 0.5 volts but less than 1.25 volts to prevent an unwanted OFF to ON write transition during the read operation.

Release operations use a voltage applied between release gate RG and floating gate nanotube element FGNT. Release voltages will range in the 2.1 to 6.5 volt range, depending on block versus bit level release considerations, as described below.

FIG. 5 illustrates the write mechanism based on applied voltages and relative capacitance values. The NT select voltage range shown was calculated for the write operation. FIG. 5a illustrates conditions to switch the NT-FET device from the OFF to ON (write "1") state. FIG. 5b illustrates conditions to maintain the NT-FET device in the OFF state.

Figure 6:
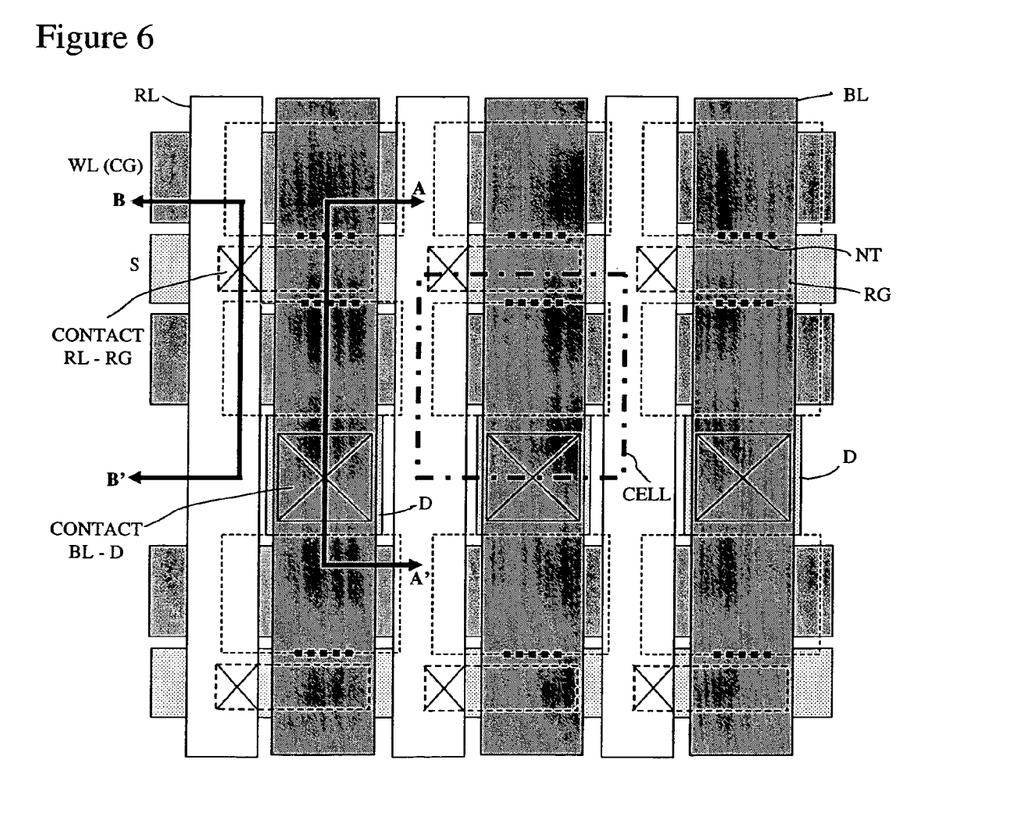
FIG. 6 is a plan view of a physical layout of a four terminal device according to certain embodiments of the invention.

The NT-FET device may be used for very dense NRAM memory array as illustrated in top view in FIG. 6. A cell boundary is shown and labeled CELL. The word line WL forms the control gate CG. The release line RL contacts RG. There typically is a covering layer and a release gap between RG and NT, such a covering layer may be made from insulating, semiconducting, or metallic material. Array symmetry allows RG gate sharing between two adjacent cells. Array lines RL and RG are orthogonal to enable a single bit release option. The NTs are mounted in the vertical direction. The source diffusion is continuous between cells. Drain diffusions are shared between two adjacent cells and are contacted by a bit line BL. The BLs and WLs are ideally orthogonal.

Figure 7:
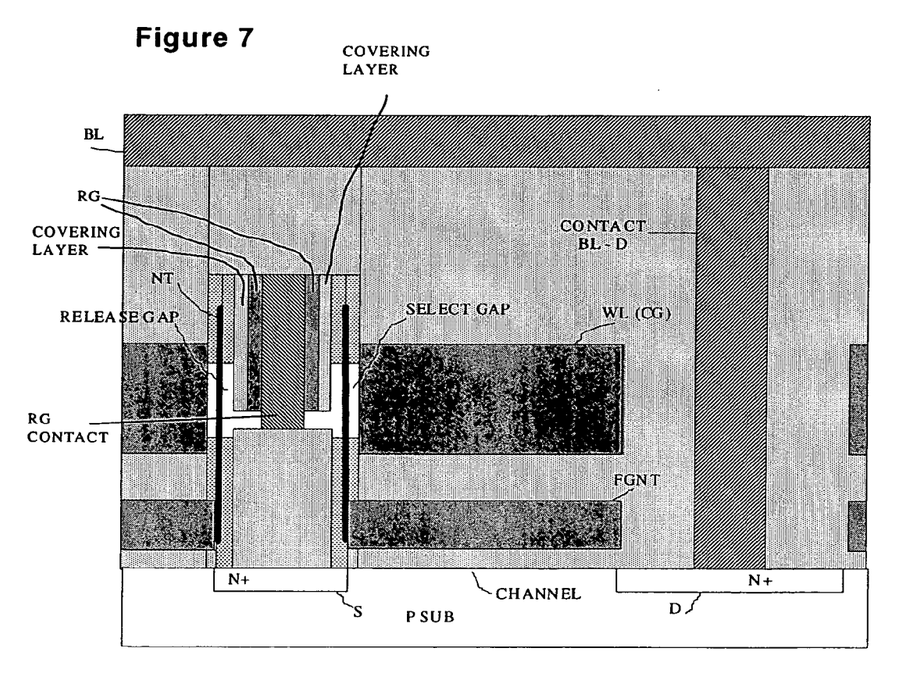
FIG. 7 is a cross sectional view along axis AA' of FIG. 6. The release plate includes an insulating, semiconducting, or conducting layer.

Cross section AA' is cut through the a bit line BL, bit line diffusion contact, the device along the FET channel, the NT devices, word line WL, and release gate RG. FIG. 7 is a cross-sectional view of a cell taken along line AA'. In this arrangement, the nanotube elements NT are suspended vertically, as suggested in FIG. 2b, and illustrated in a vertical and un-deflected position. In the ON state (store a "1"), nanotube element NT is in contact with CG. In the OFF state (store a "0"), nanotube element NT is in contact with RG the insulating, semiconducting, or metallic material covering layer.

Figure 8:
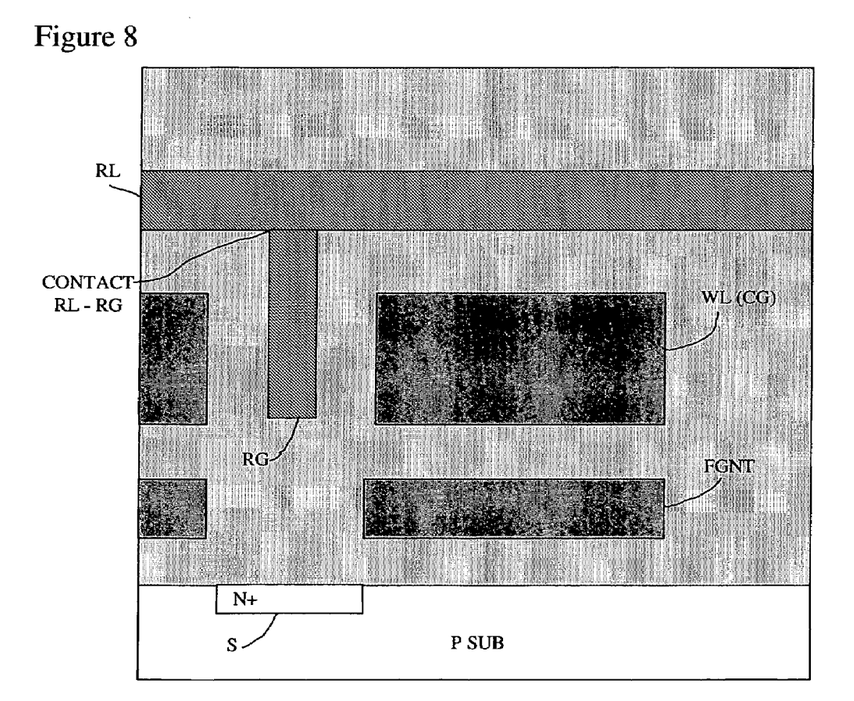
FIG. 8 is a cross sectional view along axis BB' of FIG. 6.

Cross section BB' of FIG. 6 is cut through and along release line RL, RG and RL-RG contact, WL and FGNT over the field region of the FET device, and shared source S diffusion. FIG. 8 is a cross-sectional view of a cell taken along line BB'.

Figure 9:
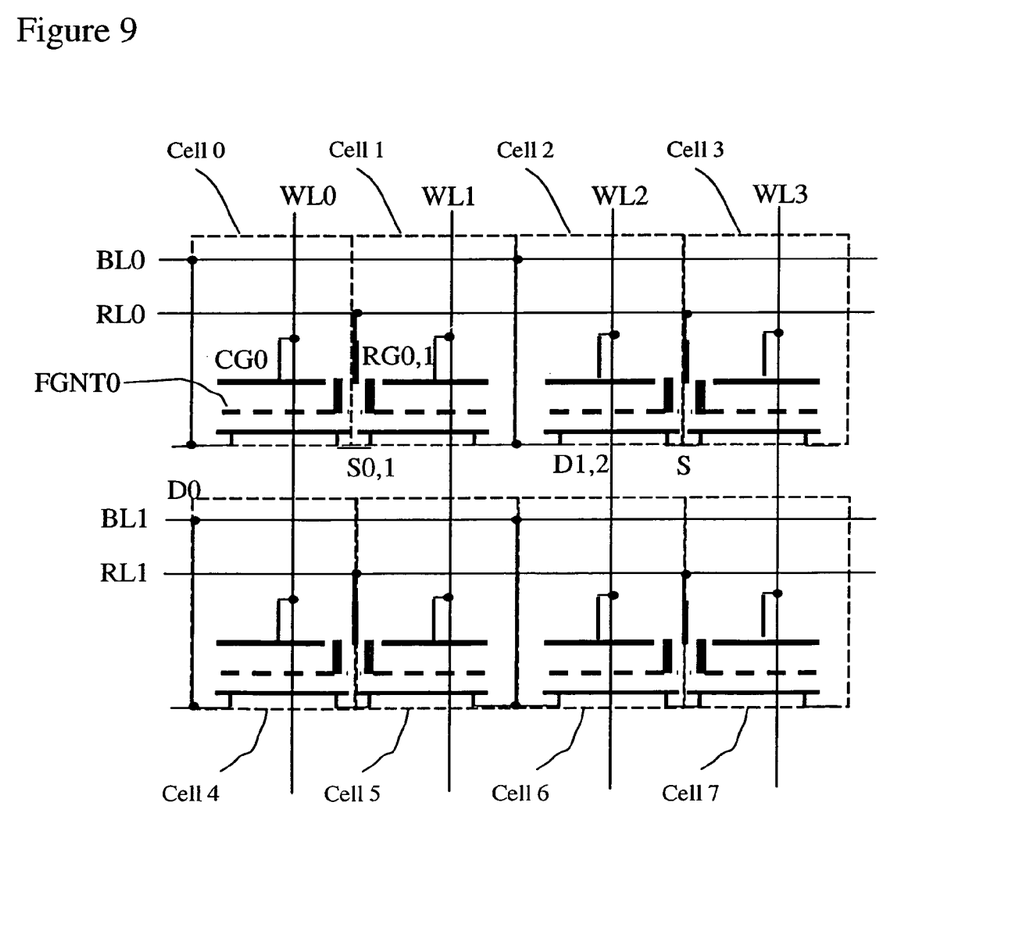
FIG. 9 is a schematic for an 8-bit array NRAM array based on the cell layout of FIG. 6.

FIG. 9 is a schematic for an 8-bit array NRAM array based on the cell layout of FIG. 6. The array is composed of eight non-volatile memory (storage) cells labeled 0 to 7 using the integrated NT-FET device. The memory array includes word, bit, and release lines that are selected by decoders (not shown), and sense amplifiers (not shown) to detect the state (ON or OFF) of the array cells. The array of FIG. 9 may be a sub-array of a much larger memory. Typical operating voltages are applied to the array using word lines, bit lines, and release lines. The resulting internal cell voltages are calculated as described in connection with the descriptions of FIGS. 3, 4, and 5. These calculations give typical FET device operating voltages for gate, source, and drain. Corresponding NT operating ranges for select and release modes are calculated. The array of FIG. 9 may be operated in several release modes. The chosen mode of operation determines the required NT select and release voltage operating ranges.

Three release operating modes were considered: block, nibble (½ byte), and single bit release. For the array in FIG. 9, the block mode results in the simultaneous release of all NT-FETs in all eight array cells. For the nibble release mode, four of the eight NT-FETs in the eight array cells are simultaneously released. For single bit release, only one NT-FET is released out of the eight cells in the array. The block release mode is the simplest and results in the broadest range of NT release voltages. The other release modes are more restrictive because some of the array cells of FIG. 9 are not released, and this requirement introduces additional electrical constraints.

Figure 10:
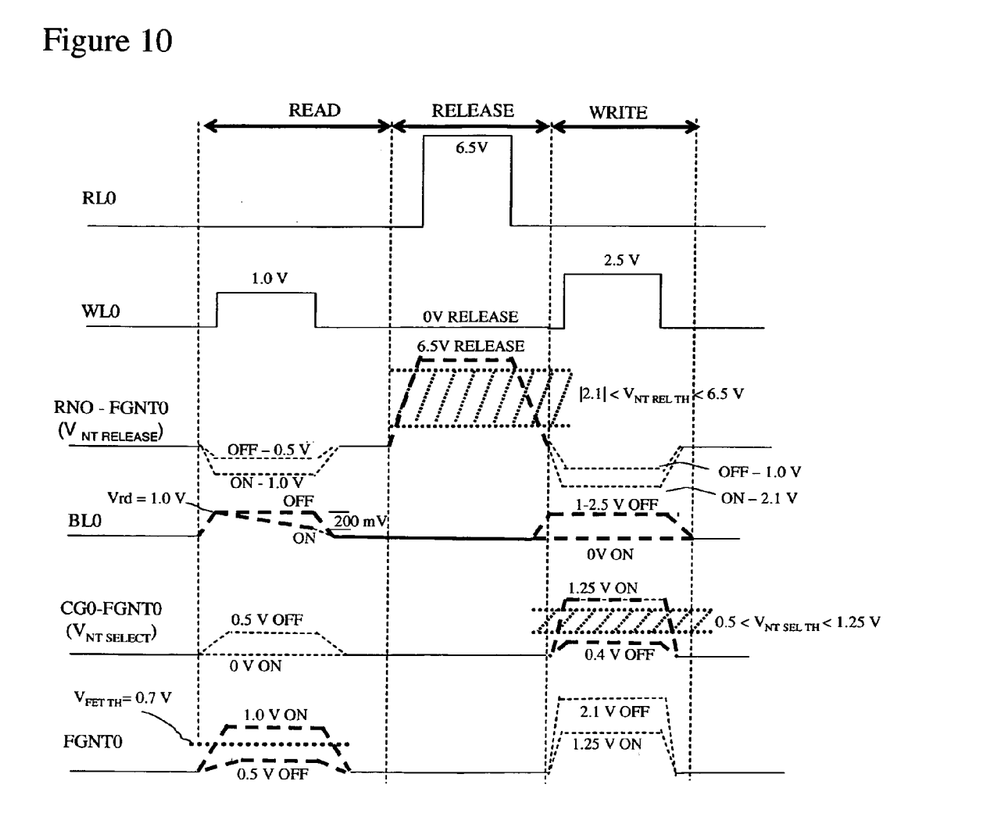
FIG. 10 illustrates the operating voltages of the array of FIG. 9 in a block release mode.

FIG. 10 shows the operating voltages of the array of FIG. 9 applied to Cell 0. Cell 0 operation is the same as that of all array cells (cells 0–7). In FIG. 10, a block release mode is employed such that cells 0–7 are all simultaneously released. Prior to release, individual cells may be in the ON or OFF state. During the release time interval, if Cell 0 is in the ON state, then Cell 0 switches to the OFF state. If, however, Cell 0 is in the OFF state, then Cell 0 remains in the OFF state. The externally applied voltages to the terminals of device NT-FET0 in array Cell 0 are WL0 driving CG0, RL0 driving RG0, BL0 driving drain diffusion D0, and the voltage applied to the shared source S0 (not shown). These externally applied voltages couple to the internal nodes of device NT-FET0, as explained in connection with the description of FIGS. 3, 4, 5, and result in the internal voltage applied to FGNT0. The combination of external and internal voltages results in the $V_{NT\ RELEASE}$ and $V_{NT\ SELECT}$ used to activate nanotube NT0 during release and write operations.

In the example illustrated in FIG. 10, a release voltage of 6.5 volts was chosen. However, 10 volts may be applied, for example, without affecting the array devices. The maximum voltage that can be applied is limited by the RL0 peripheral driver considerations because RG0 to FGNT0 capacitance $C_{27}$ is small. If the array device prior to release is in the ON state, then word line WL0 is electrically connected to FGNT0, and FGNT0 is held at ground by WL0. If the array device prior to release is in the OFF state, then FGNT0 is not directly coupled to WL0, but remains near ground because of capacitive coupling to WL0, and negligible capacitive coupling between FGNT0 and RN0 (RN0 is connected to RL0). Therefore, if RL0 is driven up to 6.5 volts, then $V_{NT\ RELEASE}$=6.5 volts is applied through the insulator layer and across the release gap of NT0, ensuring that NT0 is in the OFF state prior to write as illustrated in FIG. 10. The release voltage may be sufficiently high to cause NT to deflect into contact with, or into close proximity to, the insulating layer on RG, with NT held in the "OFF" state by van der Waals forces. The release threshold of NT0 for this example is $V_{NT\ REL\ TH}$<6.5 volts. During write, $V_{NT\ RELEASE}$ can reach −2.1 volts. To ensure that release cannot occur during write, the release threshold voltage requirement is |2.1|< $V_{NT\ REL\ TH}$<6.5 volts.

The write operation is preceded by a release operation so that device NT-FET0 of Cell 0 is in the OFF state. To turn device NT-FET0 ON, the bit line BL0 voltage Vd equals 0. The FGNT0 voltage transition is controlled by capacitance coupling and reaches 1.25 volts as WL0 voltage transitions to 2.5 volts as illustrated in FIG. 5. Therefore, the NT0 select voltage $V_{NT\ SELECT}$ equals 1.25 volts as shown in FIG. 10. For a NT0 structure with select threshold $V_{NT\ SEL\ TH}$ less than 1.25 volts, device NT-FET0 switches to the ON state. To leave device NT-FET0 in the OFF state, Vd is held in the 1 to 2.5 volt range. FGNT0 transitions to 2.1 volts as illustrated in FIG. 5. Therefore, the NT0 select voltage is limited to $V_{NT\ SELECT}$ equals 0.4 volts. For a NT0 structure with select threshold $V_{NT\ SEL\ TH}$ greater than 0.4 volts, device NT-FET0 remains in the OFF condition. The NT0 structure threshold voltage requirement during write mode is $V_{NT\ SEL\ TH}$ greater than 0.4 volts and less than 1.25 volts. The source voltage Vs (not shown) is left in open (not used) during the write operation.

During the read operation, BL0 is selected by the peripheral bit decoder/driver (not shown), set high and released at Vd equal to 1 volt. The common source is held at Vs equal to 0 volts. WL0 transitions to 1 volt. If NT-FET0 is in the ON state, then FGNT0 transitions to 1 volt since FGNT0 is electrically connected. If the FET threshold voltage $V_{TH}$ of device NT-FET0 is 0.7 volts, then the channel region is inverted and bit line BL0 is discharged. If, however, NT-FET0 is in the OFF state, then word line WL0 voltage is capacitively coupled to FGNT0, with FGNT0 switching to 0.5 volts. For an FET threshold voltage $V_{TH}$ equal to 0.7 volts, the FET channel of device NT-FET0 remains off, and the BL0 is not discharged.

Figure 11:
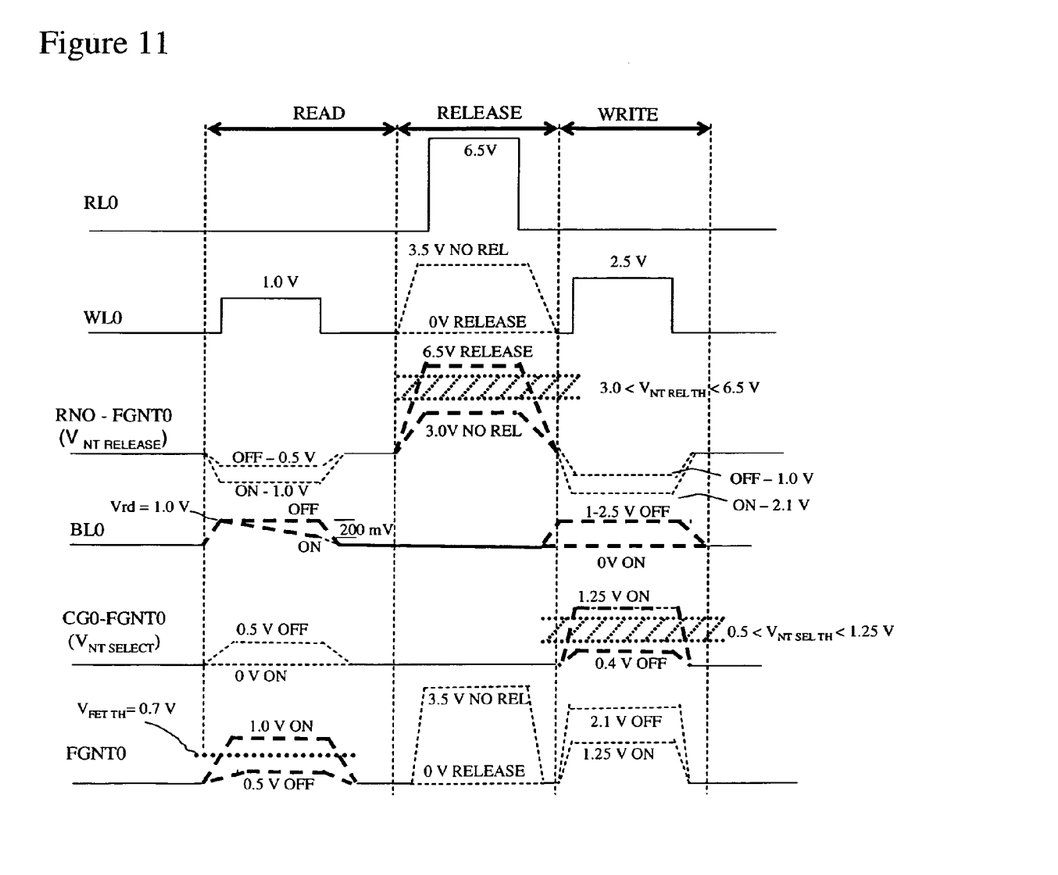
FIG. 11 illustrates voltages of the array of FIG. 9 in single bit or nibble release modes.

For the single bit release mode, the read and write waveforms of FIG. 10 are unchanged. However, the release waveforms are changed as shown in FIG. 11. If Cell 0 is to be released, then RL0 is switched to 6.5 V with WL0 at 0 volts as previously discussed. However, if another cell such as Cell 1 NT-FET1 is to be released, without disturbing the state of NT-FET0 in Cell 0, then the WL0 voltage must be increased to reduce the release voltage $V_{NT\ RELEASE}$ to a value below the release threshold voltage $V_{NT\ REL\ TH}$. This in turn increases the voltage on gate FGNT0. The source and drain voltages of device NT-FET0 are held at the same voltage so no current flows in the FET channel during the release mode. The voltage applied to WL0 (CG0) is limited by the voltage across the gate oxide of NT-FET0, especially in the ON state, when FGNT0 and CG0 are electrically connected. Assuming a gate oxide voltage limit of 3.5 volts, then the WL0 voltage limit is 3.5 volts. To prevent the RL0 voltage of 6.5 volts from releasing NT0 of device NT-FET0, WL0 is switched to 3.5 volts. The release voltage $V_{NT\ RELEASE}$ in Cell 0 is reduced to 3.0 volts. If the release threshold $V_{NT\ REL\ TH}$ voltage of NT0 is greater than 3.0 volts, NT-FET0 remains unchanged. Then, $V_{NT\ REL\ TH}$ is greater than 3 volts and less than 6.5 volts becomes the release voltage range for the single bit release mode of operation. Nibble (4 bit, ½ byte release) allows half the array to be released simultaneously. Since not all bits are released simultaneously, the same release voltage range of $V_{NT\ REL\ TH}$ greater than 3.0 volts and less than 6.5 volts is used as in the single bit release mode.

Under preferred embodiments, a NT element and an FET device are effectively integrated into a single non-volatile device referred to as a NT-FET device. The external read and write voltages are low, in the 1 to 2.5 volt range, and the device operates at low voltage and current values. The release voltage is at least 6.5 volts, but has minimal effect on the internal NT-FET capacitance coupled voltages, because the release gate RG to FGNT capacitance $C_{27}$ is very small as a consequence of the array structure/layout. Layout of an NRAM cell based on the NT-FET device can produce a cell of less than 8 $F^2$ size. This cell can support single bit access for read, write, and release modes.

Table 1 provides a summary of the operating modes and voltage conditions for a preferred NT-FET device for assumed relative capacitance values. Changing assumed capacitance ratios and applied voltages changes the select and release conditions of the NT-FET device. These values are CG to FGNT capacitance $C_{12}$ equals $C_{23}$, the FGNT to FET channel capacitance. Depletion layer capacitance $C_{36}$ equals 0.2 $C_{23}$. The much smaller release gate RG to FGNT capacitance $C_{27}$ is less than 0.1 $C_{12}$, and $C_{23}$, and has minimal impact on the internal NT-FET voltage levels resulting from capacitance coupling. These capacitances are illustrated in FIG. 3.

| MODE/CONDITION | $V_{CG}$ | Vd | Vs | $V_{FGNT^*}$ | $V_{NT\ SELECT+}$ | $V_{RG}$ | $V_{NT\ RELEASE++}$ |
|---|---|---|---|---|---|---|---|
| READ | | | | | | | |
| ON | 1.0 | 1.0 float | 0 | 1.0 | 0 | 0 | −1.0 |
| OFF | 1.0 | 1.0 float | 0 | 0.5 | 0.5 | 0 | −0.5 |
| WRITE "1" OFF -> ON | 2.5 | 0 | float | 1.25 | 1.25 | 0 | −1.25 |
| WRITE "0" | 2.5 | 1–2.5 | float | 2.1 | 0.4 | 0 | −2.1 |

-continued

| MODE/CONDITION | $V_{CG}$ | Vd | Vs | $V_{FGNT}*$ | $V_{NT\ SELECT}+$ | $V_{RG}$ | $V_{NT\ RELEASE}++$ |
|---|---|---|---|---|---|---|---|
| OFF -> OFF RELEASE | | | | | | | |
| BLOCK REL ON/OFF | 0 | any | any | 0 | 0 | 6.5 | \|2.1\| < & < 6.5 |
| BIT/NIBBLE REL RELEASE ON/OFF | 0 | any | any | 0 | 0 | 6.5 | \|2.1\| < & < 6.5 |
| NO RELEASE | | | | | | | |
| ON | 3.5 | 1–2.5 | float | 3.5 | 0 | 6.5 | 3 < & < 6.5 |
| OFF | 3.5 | 1–2.5 | float | 3.0 | 0.5 | 6.5 | 3 < & < 6.5 |

*FET $V_{TH}$ = 0.7 volts   Vd droops if NT-FET device is ON;
Vd unchanged if NT-FET device is OFF +$V_{NT\ SELECT} = V_{CG} - V_{FGNT}$   Requirement   $0.5 < V_{NT\ SEL\ TH} < 1.25$ volts
++$V_{NT\ RELEASE} = V_{RG} - V_{FGNT}$   Requirements
Block Release:   $|2.1| < V_{NT\ REL\ TH} < 6.5**$ volts
Bit/Nibble Release:   $3.5 < V_{NT\ REL\ TH} < 6.5$ volts

**Note:
limited by RL driver; can go to 10 volts

The nanotube element of preferred devices may be constructed as explained in the following U.S. patents and/or applications, all of which are incorporated by reference in their entirety. Preferred nanotube elements are made from a porous fabric of nanotubes. In certain embodiments, the fabric is highly porous and is substantially a monolayer of single-walled carbon nanotubes. See, e.g., U.S. Pat. Nos. 6,574,130, 6,643,165, and 6,706,402; See also U.S. Patent Publication Nos. 2003-0021966, 2003-0124325, 2003-0124837, and 2003-199172; and U.S. patent application Ser. Nos. 10/341,005, 10/341,054, 10/341,055, 10/341,130, 10/776,059, and 10/776,572.

In at least some cases, to create a nanofabric, the technique chosen must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs). The nanofabric is patterned using photolithographic techniques generating an electrically conductive trace of nanotubes, NT.

Other embodiments may employ double-walled nanotubes, including such nanotubes with metallic properties.

The preferred embodiment uses electrostatic attractive forces to deflect the nanotube element, but other embodiments may use repulsive forces.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A non-volatile transistor device, comprising:
a source region and a drain region of a first semiconductor type of material and each in electrical communication with a respective terminal;
a channel region of a second semiconductor type of material disposed between the source and drain region;
a gate structure made of at least one of semiconductive or conductive material and disposed over an insulator over the channel region;
a control gate made of at least one of semiconductive or conductive material and in electrical communication with a respective terminal;
an electromechanically-deflectable nanotube switching element in electrical communication with one of the gate structure and the control gate structure and positioned to be electromechanically deflectable into contact with the other of the gate structure and the control gate structure, wherein when the nanotube switching element is in communication with both the control gate and the gate structure, the control gate may be used to modulate the conductivity of the channel region.

2. The non-volatile transistor device of claim 1 wherein the nanotube switching element is an article formed from a porous fabric of nanotubes.

3. The non-volatile transistor device of claim 1 wherein the fabric is substantially a monolayer of nanotubes.

4. The non-volatile transistor device of claim 1 wherein the nanotubes are single-walled carbon nanotubes.

5. The non-volatile transistor device of claim 1 wherein the source and drain regions are disposed on or in a horizontal substrate and wherein the nanotube article is suspended vertically in relation to the horizontal substrate.

6. The non-volatile transistor device of claim 1 further comprising a release gate and release node positioned in spaced relation to the nanotube switching element, wherein, in response to a signal on the release node, the release gate electromechanically deflects the nanotube switching element out of contact with the one of the control gate and gate structure.

7. The non-volatile transistor of claim 1 wherein the one of the control gate and gate structure includes a covering layer and wherein the nanotube switching element switches out of contact with the one of the control gate and gate structure and into contact with the covering layer.

8. The non-volatile transistor device of claim 1 wherein the contact between the nanotube switching element and the one of the control gate and gate structure is a non-volatile state.

9. The non-volatile transistor device of claim 1 wherein the one of the control gate and the gate structure includes a covering layer and wherein the contact between the nanotube switching element and the one of the control gate and the gate structure is a non-volatile state.

10. The non-volatile transistor device of claim 1 wherein modulation of the conductivity of the channel region includes inverting the channel region.

11. The non-volatile transistor device of claim 1 wherein the device occupies an area of $8F^2$ wherein F is a minimum feature size.

12. The non-volatile transistor device of claim 6 wherein the release node includes a covering layer made from insulating material.

13. The non-volatile transistor device of claim 6 wherein the release node includes a covering layer made from semiconducting material.

14. The non-volatile transistor device of claim 6 wherein the release node includes a covering layer made from metallic material.

15. An array of non-volatile transistor devices, comprising at least two devices, each device including:
 a source region and a drain region of a first semiconductor type of material and each in electrical communication with a respective terminal;
 a channel region of a second semiconductor type of material disposed between the source and drain region;
 a gate structure made of at least one of semiconductive or conductive material and disposed over the channel region;
 a control gate made of at least one of semiconductive or conductive material and in electrical communication with a respective terminal;
 an electromechanically-deflectable nanotube switching element in electrical communication with one of the gate structure and the control gate structure, and positioned to be electromechanically deflectable into contact with the other of the gate structure and the control gate structure wherein when the nanotube switching element is in communication with both the control gate and the gate structure, the control gate may be used to modulate the conductivity of the channel region, and
 wherein the array includes a release line and a release node shared by at least two adjacent transistor devices, the release node positioned in spaced relation to each of the nanotube switching elements, wherein, in response to a signal on the release node, the release gate electromechanically deflects the nanotube switching elements out of contact with the respective ones of the control gates and gate structures.

16. The array of claim 10 wherein the release node includes a covering layer and wherein in response to a signal on the release node, the release gate electromechanically deflects the nanotube switching elements out of contact with the respective ones of the control gates and gate structures, and into contact with the covering layer on the release gate.

17. The array of claim 16 wherein the release node includes a covering layer made from insulating material.

18. The array of claim 16 wherein the release node includes a covering layer made from semiconducting material.

19. The array of claim 16 wherein the release node includes a covering layer made from metallic material.

* * * * *